(12) United States Patent
Kim

(10) Patent No.: US 10,403,691 B2
(45) Date of Patent: Sep. 3, 2019

(54) DISPLAY DEVICE INCLUDING BUFFER MEMBER

(71) Applicant: SAMSUNG DISPLAY CO., LTD., Yongin-si, Gyeonggi-do (KR)

(72) Inventor: Yunjae Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/008,419

(22) Filed: Jan. 27, 2016

(65) Prior Publication Data

US 2016/0218153 A1    Jul. 28, 2016

(30) Foreign Application Priority Data

Jan. 28, 2015  (KR) .................. 10-2015-0013649

(51) Int. Cl.
*H01L 33/00* (2010.01)
*H01L 27/32* (2006.01)
*G09G 3/00* (2006.01)

(52) U.S. Cl.
CPC ............. *H01L 27/323* (2013.01); *G09G 3/00* (2013.01)

(58) Field of Classification Search
CPC ................................ H01L 27/323; G09G 3/00
USPC .......................................................... 257/99
See application file for complete search history.

(56) References Cited

U.S. PATENT DOCUMENTS

| | | | | |
|---|---|---|---|---|
| 9,323,289 | B2 * | 4/2016 | Oohira | ............ G06F 1/1643 |
| 2001/0002145 | A1 * | 5/2001 | Lee | ............ G02F 1/133308 |
| | | | | 349/58 |
| 2007/0019275 | A1 * | 1/2007 | Okuda | ............ G02F 1/133615 |
| | | | | 359/265 |
| 2009/0257181 | A1 * | 10/2009 | Ha | ............ H01L 51/5237 |
| | | | | 361/679.26 |
| 2010/0253872 | A1 * | 10/2010 | Park | ............ G02B 6/0031 |
| | | | | 349/58 |
| 2011/0134075 | A1 * | 6/2011 | Takusa | ............ G06F 3/044 |
| | | | | 345/174 |
| 2014/0078692 | A1 | 3/2014 | Park et al. | |
| 2014/0152596 | A1 * | 6/2014 | Park | ............ G06F 1/1626 |
| | | | | 345/173 |
| 2015/0162388 | A1 | 6/2015 | Kim | |

FOREIGN PATENT DOCUMENTS

| | | |
|---|---|---|
| KR | 10-2005-0064861 A | 6/2005 |
| KR | 10-2014-0038021 A | 3/2014 |
| KR | 10-1424135 B1 | 8/2014 |

OTHER PUBLICATIONS

Abstract (Machine Translation) to KR 10-2012-0149731 A Which Corresponds to KR 10-1424135 B1 Listed Above.

* cited by examiner

*Primary Examiner* — Anthony Ho
*Assistant Examiner* — Mohammad M Hoque
(74) *Attorney, Agent, or Firm* — Lewis Roca Rothgerber Christie LLP

(57) ABSTRACT

A display device including a display panel having a display area and a pad area, a circuit board connected to the pad area and configured to apply an electric signal to the display panel, a set frame configured to accommodate the display panel, and a buffer member between a surface of the display panel and the set frame. The buffer member may include a base and a protrusion adjacent the base and protrude from an edge portion of the display panel.

21 Claims, 5 Drawing Sheets

DISPLAY DEVICE INCLUDING BUFFER MEMBER

CROSS-REFERENCE TO RELATED APPLICATION

This application claims priority to and the benefit of Korean Patent Application No. 10-2015-0013649, filed on Jan. 28, 2015, with the Korean Intellectual Property Office ("KIPO"), the disclosure of which is incorporated herein by reference in its entirety.

BACKGROUND

1. Field

Embodiments of the present invention relate to a display device capable of preventing detachment of a circuit board.

2. Description of the Related Art

In general, flat panel display devices, such as a liquid crystal display ("LCD") device and an organic light emitting diode ("OLED") display device, include a plurality of pairs of electrodes which generate an electric field and an electro-optical active layer interposed therebetween. The LCD device may include a liquid crystal layer as the electro-optical active layer, and the OLED display device may include an organic light emitting layer as the electro-optical active layer.

The OLED display device may emit light using energy generated when holes and an electrons respectively injected from an anode and a cathode are combined with each other in a light emission unit, such that colors may be displayed. The OLED display device may have a stacked structure in which a light emitting layer is disposed between the anode serving as a pixel electrode and the cathode serving as an opposing electrode.

Such an OLED display device may include a circuit board which is mounted with electronic elements for driving the OLED display device. The circuit board may be bent in a pad area of a display panel and located on a rear surface of the display panel, such that the circuit board is not visible and downsizing is achieved. Due to the advancement in reducing the thickness of the OLED display device, a diameter of the bent portion of the circuit board is further decreased, such that a crack may appear at the bent portion of the circuit board and a detachment defect may occur between the display panel and the circuit board. Accordingly, as the thickness of the OLED display device decreases, a defect ratio may increase due to the circuit board.

Accordingly, in order to realize a product with higher device reliability, a structure for preventing detachment of the circuit board is desirable.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device including a buffer member capable of preventing detachment of a circuit board.

According to an aspect of an exemplary embodiment of the present invention, a display device includes: a display panel having a display area and a pad area; a circuit board connected to the pad area, and configured to apply an electric signal to the display panel; a set frame configured to accommodate the display panel; and a buffer member between a surface of the display panel and the set frame, wherein the buffer member includes: a base; and a protrusion adjacent the base and protruding from an edge of the display panel.

The circuit board may be between the set frame and the buffer member.

The display device may further include a double-sided tape between the buffer member and the circuit board.

The circuit board may be bent along a lateral surface of the display panel.

The protrusion may be disposed at a bent portion of the circuit board.

The display panel may include: a first substrate having the display area and the pad area; and a second substrate disposed oppose the first substrate.

The circuit board may include a first circuit board on an upper surface of the first substrate in the pad area.

The first circuit board may be bent along a lateral surface of the first substrate.

The protrusion may be disposed at a bent portion of the first circuit board.

The display device may further include a touch unit on the second substrate.

The circuit board may include a second circuit board on an upper surface of the second substrate, and the circuit board may be connected to the touch unit.

The second circuit board may be bent along lateral surfaces of the first substrate and the second substrate.

The protrusion may be disposed at a bent portion of the second substrate.

The touch unit may correspond to the display area.

The electric signal may include at least one of a power signal, a driving signal, a control signal, and a data signal.

According to embodiments of the present invention, the display device may improve detachment defects of a circuit board.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the embodiments of the present invention will be more clearly understood from the following detailed description taken in conjunction with the accompanying drawings, in which.

DETAILED DESCRIPTION

Figure 1:
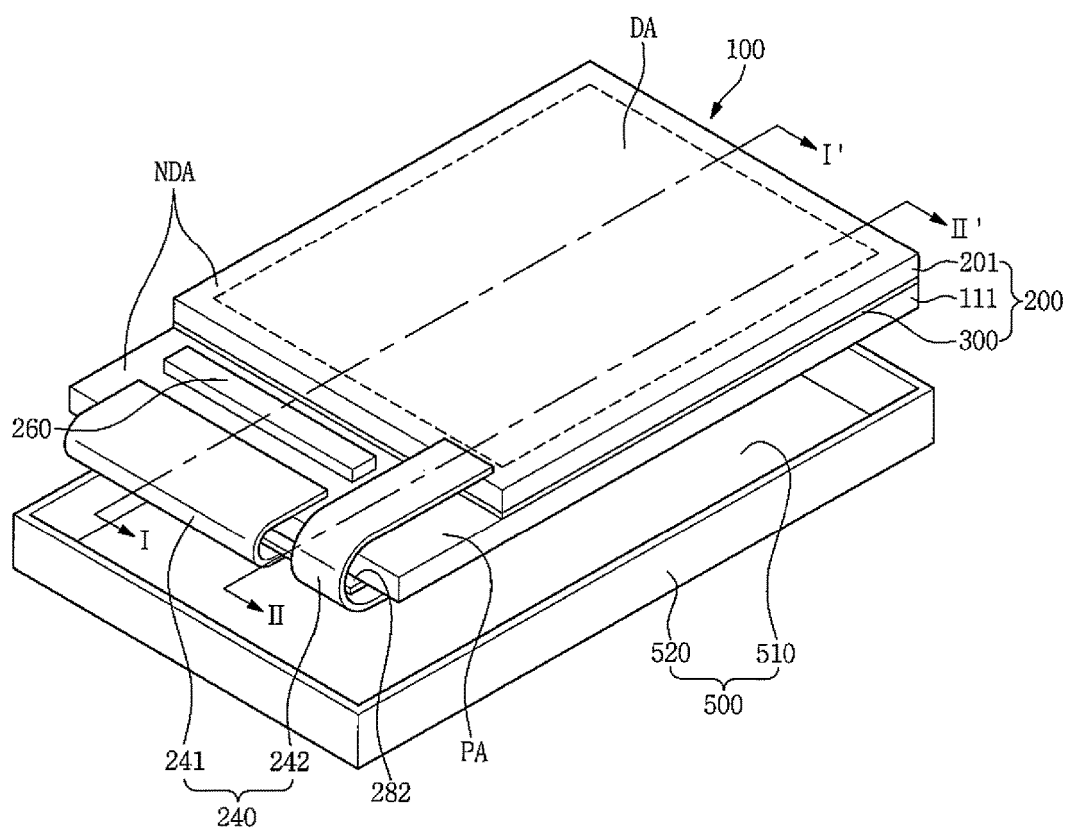
FIG. 1 is a schematic perspective view illustrating a display device according to a first exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Further, accompanying drawings illustrate an active-matrix type organic light emitting diode (AMOLED) device having a 2Tr-1 Cap structure, which includes two thin film transistors ("TFT") and a capacitor in each pixel, by way of example, but the present invention is not limited thereto. Accordingly, the number of TFT, the number of capacitors, and the number of wirings may not be particularly limited in the organic light emitting diode ("OLED") display device. Herein, the term "pixel" refers to the smallest unit for displaying an image, and the OLED display device may display an image using a plurality of pixels.

An OLED display device including an organic light emitting layer is described hereinbelow as an example of a display device. However, the present invention is not limited thereto. For example, the display device according to the present invention may be a liquid crystal display ("LCD") device, a plasma display panel ("PDP") device, and/or an electrophoretic display ("EPD") device.

Hereinafter, a display device according to a first exemplary embodiment will be described in detail with reference to FIGS. 1 through 6.

Figure 2:
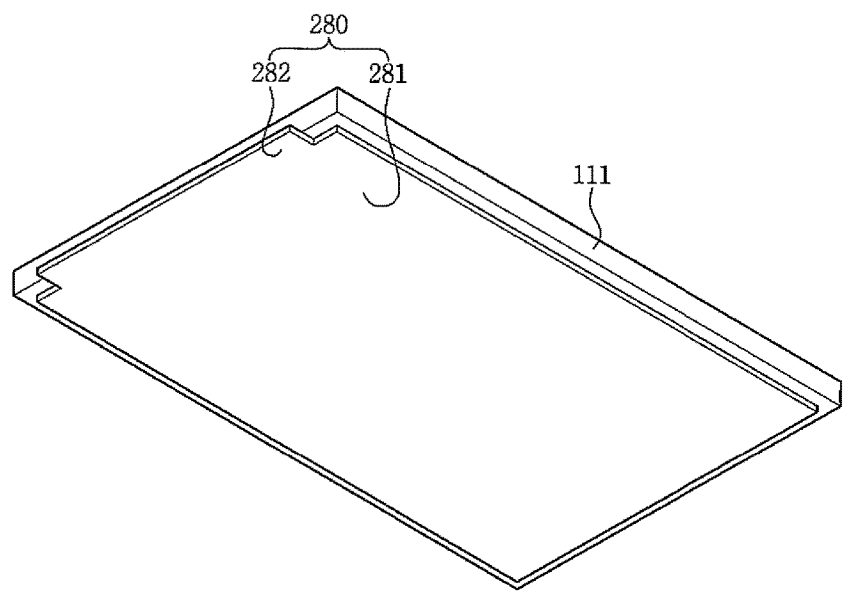
FIG. 2 is a schematic perspective view illustrating a buffer member of FIG. 1.
Figure 3:
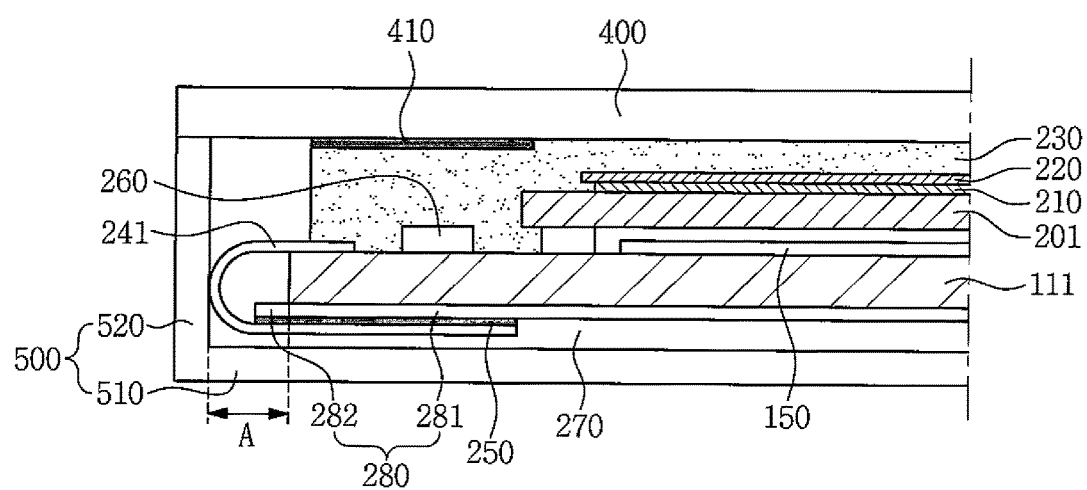
FIG. 3 is a cross-sectional view taken along the line I-I' of FIG. 1.
Figure 4:
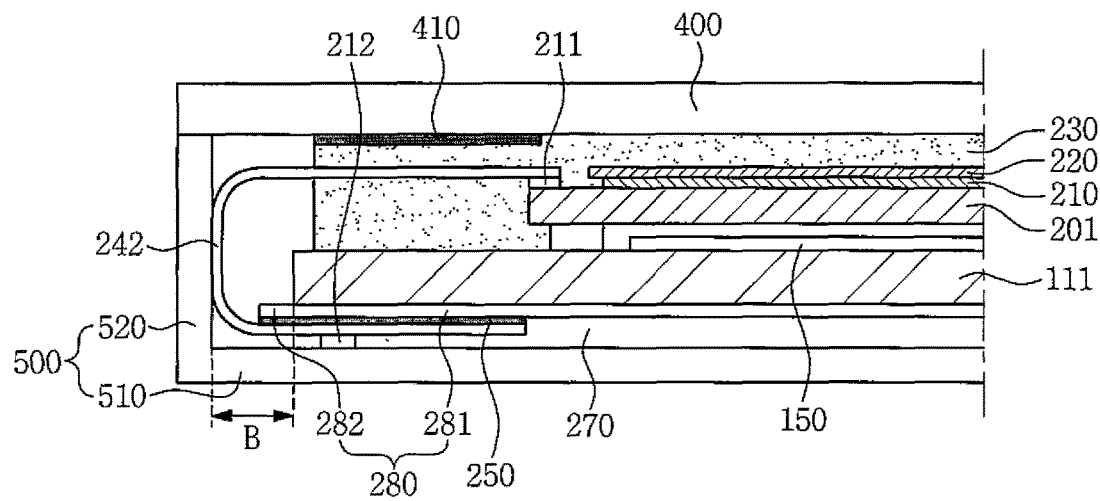
FIG. 4 is a cross-sectional view taken along the line II-II' of FIG. 1.

FIG. 1 is a schematic perspective view illustrating the display device according to the first exemplary embodiment. FIG. 2 is a schematic perspective view illustrating a buffer member of FIG. 1. FIG. 3 is a cross-sectional view taken along the line I-I' of FIG. 1. FIG. 4 is a cross-sectional view taken along the line II-II' of FIG. 1.

In reference to FIGS. 1 through 4, an OLED display device 100 according to the first exemplary embodiment includes a display panel 200, a touch driving chip 212; an adhesive layer 230, a circuit board 240, a double-sided tape 250, a driving chip 260, a buffer member 280, a window 400, a black matrix 410, and a set frame 500.

The display panel 200 is configured to display an image. For example, the display panel 200 may be an LCD panel, an EDP panel, an OLED panel, a light emitting diode ("LED") panel, an inorganic electro luminescent ("EL") display panel, a field emission display ("FED") panel, a surface conduction electron-emitter display ("SED") panel, a plasma display panel ("PDP"), or a cathode ray tube ("CRT"). However, these are merely illustrated as examples and any suitable kind of display panels that are currently developed and commercialized or to be realized with future technology advancement may be applicable to the display panel 200 according to the embodiments of the present invention.

The display panel 200 includes a first substrate 111, a second substrate 201 opposing the first substrate 111, a display unit 150, a sealant 300, a touch unit 210, a touch pad unit 211, and a polarizer 220, but the present invention is not limited thereto. For example, the first substrate 111 may be encapsulated by an encapsulation film and the like instead of the second substrate 201.

The first substrate 111 may include a display area DA for displaying an image by light emission and a non-display area NDA positioned at an outline of the display area DA (i.e., around a perimeter of the display area DA). A plurality of pixels may be formed in the display area DA of the first substrate 111 to display an image. The display unit 150 may be located in the display area DA.

The non-display area NDA may include a pad area PA on which a plurality of pad electrodes are formed to receive an external signal which allows an OLED to perform light emission and supply the signals to the OLED. At least one driving chip 250 may be formed on the pad area PA.

The first substrate 111 may include a transparent glass material primarily formed of silicon oxide ($SiO_2$). However, the first substrate 111 is not limited thereto, and thus may be formed of, for example, a transparent plastic material.

The display unit 150 may be formed on the first substrate 111 and may be connected to the driving chip 260. The display unit 150 may include an OLED, and a thin film transistor and wirings to operate the OLED. While the display unit 150 is described with reference to an OLED, of course, the display unit in practice would include a plurality of OLEDs to display an image, and such display unit is within the scope of the present invention. The display unit 150 will be described further below with reference to FIGS. 5 and 6. Aside from the OLED, any elements that may be utilized as a display device may constitute the display unit 150.

The second substrate 201 may be disposed to oppose the first substrate 111 and may be bonded to the first substrate 111 through the use of the sealant 300. The second substrate 201 may cover and protect the display unit 150. The second substrate 201 may include a glass substrate and/or a transparent synthetic resin film, such as an acrylic film. Further, the second substrate 201 may also use a metal plate. For example, the second substrate 201 may include a polyethylene (PET) film, a polypropylene (PP) film, a polyamide (PA) film, a polyacetal (POM) film, a poly methyl methacrylate (PMMA) film, a polybutylene terephthalate (PBT) film, a polycarbonate (PC) film, a cellulose film, and/or moisture-resistant cellophane.

In some embodiments, the second substrate 201 may be smaller than the first substrate 111 in size. Accordingly, the pad area PA of the first substrate 111 may be exposed by the second substrate 201.

Further, the sealant 300 may include a commonly used material, such as a sealing glass frit.

The touch unit 210 may be disposed on the second substrate 201, corresponding to the display area DA of the first substrate 111. For example, the touch unit 210 may include first and second electrodes crossing each other. The first and second electrodes may be directly patterned on the second substrate 201 into an on-cell type, respectively having a plurality of columns in a matrix form. The first and second electrodes may correspond to a touch sensor pattern. In some embodiments, the touch unit 210 may be disposed on the second substrate 201 as a separately manufactured touch panel. The touch unit 210 may include the touch pad unit 211 on the second substrate 201. The touch driving chip 212 may control an operation of the touch unit 210, and may be formed on a second circuit board 242. The touch driving chip 212 may be an integrated circuit chip.

The touch unit 210 may detect a touch input by a touch apparatus and/or method, such as a pen or a user's finger, and may transmit a signal corresponding to a touched location of the touch input to the touch driving chip 212. The touch unit 210 may be used as an input apparatus or device of the OLED display device 100 and may be a resistive type or a capacitive type.

The polarizer 220 may be disposed between the window 400 and the touch unit 210. The polarizer 220 may prevent external light reflection.

The window 400 may be formed of transparent materials, such as glass or resins, and may be configured to protect the display panel 200 from breaking, for example, from an external shock. For example, the window 400 may be disposed on the touch unit 210 and may cover the display area DA and the pad area PA. The window 400 may be bonded to the second substrate 201 via the adhesive layer 230. The window 400 may be formed to be larger than the display panel 200 in size. However, the present invention is not limited thereto, and thus the window 400 may be formed to have substantially the same size as that of the display panel 200.

The black matrix 410 may be disposed on an area of the window 400 corresponding to the pad area PA. The black matrix 410 may include a printing material which may prevent the pattern disposed below the window 400 from being visible. The printing material may include a black printing material, but the color of the printing material may vary based on a design of a device to be realized. In some embodiments, the black matrix 410 may include a light absorbing material such as chromium (Cr).

The adhesive layer 230 may be disposed between the window 400 and the touch unit 210 and may improve luminance, transmittance, reflectivity, and visibility of the OLED display device 100. The adhesive layer 230 may prevent formation of an air gap between the window 400 and the second substrate 201 and may also prevent infiltration of undesired materials like dust. The adhesive layer 230 may be a resin, such as, for example, a photocurable resin.

The set frame 500 is configured to accommodate the display panel 200. The set frame 500 may surround a lateral surface and a bottom surface of the display panel 200, and may form, along with the window 400, an outer shape of the OLED display device 100 while being fixed to the window 400. The set frame 500 may include a bottom portion 510 parallel to the first substrate 111 and a lateral wall 520 extending from the bottom portion 510 toward the window 400 and facing the lateral surface of the display panel 200.

The set frame 500 may include a rigid metal, such as magnesium (Mg), magnesium (Mg) alloys, aluminum (Al), aluminum (Al) alloys, and/or stainless steel. The set frame 500 and the window 400 may be attached to each other by an adhesive member such as a gasket cushion adhesive, which may also serve as a buffer.

The driving chip 260 may include a scan driver and a data driver for operating the pixels. Further, the first substrate 111 may further include the pad electrodes disposed in the pad area PA. The driving chip 260 may be mounted in the pad area PA of the first substrate 111 in a chip-on-glass (COG) manner to be electrically connected to the pad electrode. The driving chip 260 may generate a scan signal and a data signal, corresponding to electric signals transmitted via the circuit board 240. The scan signal and the data signal may be applied to the gate line and the data line in the display area DA through the pad electrodes.

In some embodiments, the driving chip 260 may not be necessarily formed in the non-display area NDA, and may be omitted. In other embodiments, the driving chip 260 may be mounted on the circuit board 240 in a chip-on-film manner, such as, for example, a tape carrier package (TCP), in which the driving chip 260 is mounted on a film as a chip. The driving chip 260 may be an integrated circuit (IC) chip, for example, a driver IC chip.

The circuit board 240 may be connected to the pad area PA to apply electric signals to the display panel 200 and may be bent along a lateral surface of the display panel 200. The circuit board 240 may include a first circuit board 241 and a second circuit board 242.

The first circuit board 241 may be mounted with electronic elements for driving operation and may apply electric signals to the display panel 200. For example, the first circuit board 241 may be connected to the pad area PA of the display panel 200 to transmit the electric signals to the driving chip 260. The electric signals may include a power signal, a driving signal, a control signal, and/or a data signal. The first circuit board 241 may include a timing controller for generating control signals for driving the display panel 200, a power voltage generator for generating a power voltage, and/or the like.

The first circuit board 241 may be disposed on an upper surface of the first substrate 111 in the pad area PA, and may be bent along the lateral surface of the first substrate 111. In more detail, the first circuit board 241 may be disposed on the upper surface of the first substrate 111, and may be bent to be also disposed on a rear surface of the first substrate 111. The first circuit board 241 may be a flexible printed circuit board (FPCB).

The second circuit board 242 may be in contact with the touch pad unit 211 formed on the second substrate 201, which is connected to the touch unit 210, and the second circuit board 242 may include the touch driving chip 212. For example, the second circuit board 242 may be an FPCB. In more detail, the second circuit board 242 may be connected to the touch pad unit 211 of the second substrate 201 in a chip-on-film (COF) manner. In some embodiments, the second circuit board 242 may include electronic elements for processing driving signals, and may connect a sensor pattern from the touch unit 210 and the touch driving chip 212 to each other.

The second circuit board 242 may be disposed on an upper surface of the second substrate 201, which is in contact with the touch unit 210, and the second circuit board 242 may be bent along lateral surfaces of the first substrate 111 and the second substrate 201. In more detail, the second circuit board 242 may be disposed on the upper surface of the second substrate 201 and may be bent to be also disposed on the rear surface of the first substrate 111.

The display panel 200 may commonly display images on an upper surface of the display panel 200, and thus visibility to users from the rear surface of the display panel 200 may be blocked. Accordingly, in order to maximize spatial efficiency and conceal configurations, which do not have to be visible by the users, the first circuit board 241 and the second circuit board 242 may be disposed on the side of the rear surface of the display panel 200. However, the foregoing is merely described by way of example, and the first circuit board 241 and the second circuit board 242 may be disposed on a lateral surface of the display panel 200.

The first exemplary embodiment may provide an example of the circuit board 240 in which a printed circuit board for applying electric signals and a flexible printed circuit board are integrally formed. Alternatively, the printed circuit board and the flexible printed circuit board may be separately formed as in a second exemplary embodiment, which will be described further hereinbelow with reference to FIGS. 7 and 8.

A buffer member 280 may be disposed between a surface of the display panel 200 and the set frame 500. The buffer member 280 may include an elastic material, for example, rubber or silicon. In some embodiments, the buffer member 280 may include a sponge, which is formed by performing foam molding of a liquid rubber, a urethane-based material, and/or an acrylic-based material. The buffer member 280 is configured to mitigate an impact energy transferred from the set frame 500 to the display panel 200.

In some embodiments, the buffer member 280 may be spaced apart from the set frame 500. The space between the buffer member 280 and the set frame 500 may serve as a buffer space to delay transfer of the impact. Alternatively, the buffer member 280 may be in direct contact with the set frame 500.

The buffer member 280 may include a base portion 281 and a protrusion 282. The protrusion 282 may be disposed adjacent to the base portion 281 to protrude from an edge portion of the display panel 200. The base portion 281 may be disposed on the rear surface of the first substrate 111, and the protrusion 282 may be disposed at a bent portion of the circuit board 240. In other words, the protrusion 282 may be disposed at a bent portion of the first circuit board 241 and the second circuit board 242.

The circuit board 240 may be disposed between the set frame 500 and the buffer member 280. Because a conventional buffer member 280 has a size that is smaller than that of the first substrate 111, the circuit board 240, which is bent from an end portion of the conventional buffer member 280, may become detached therefrom. However, according to an embodiment of the present invention, because the buffer member 280 includes the protrusion 282, an attached portion of the circuit board 240, which is bent, may be larger, and thus the circuit board 240 may be stably attached to the protrusion 282, such that the detachment phenomenon of the circuit board 240 may be prevented or reduced.

In some embodiments, the protrusion 282 may be formed to be spaced apart from the base portion 281. In other words, the base portion 281 may be formed on the rear surface of the first substrate 111, and the protrusion 282 may be spaced apart from the base portion 281 and may protrude from an edge portion of the rear surface of the first substrate 111. That is, the base portion 281 and the protrusion 282 of the buffer member 280 may be separately manufactured.

In some embodiments, a double-sided tape 250 may be disposed between the buffer member 280 and the circuit board 240. The double-sided tape 250 may stably attach the circuit board 240 to the buffer member 280.

Hereinafter, a pixel of the display unit 150 will be described with reference to FIGS. 5 and 6.

Figure 5:
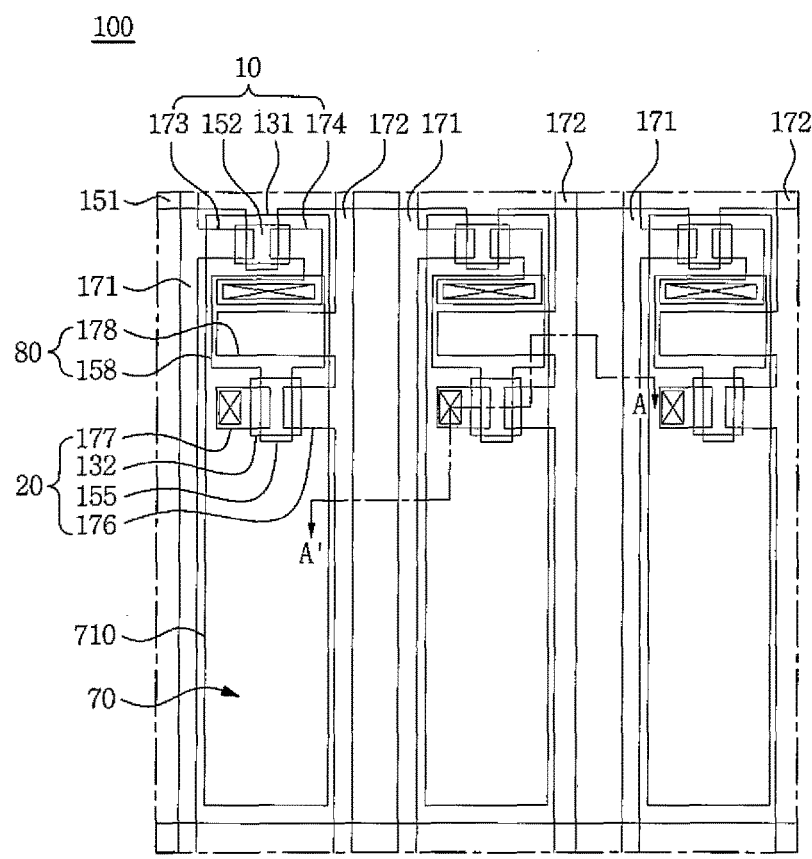
FIG. 5 is a schematic plan view illustrating a pixel of a display device.

FIG. 5 is a schematic plan view illustrating the pixel of the display device. FIG. 6 is a cross-sectional view taken along the line A-A' of FIG. 5.

The display area DA according to the present exemplary embodiment will be described hereinbelow with reference to FIGS. 5 and 6.

Figure 6:
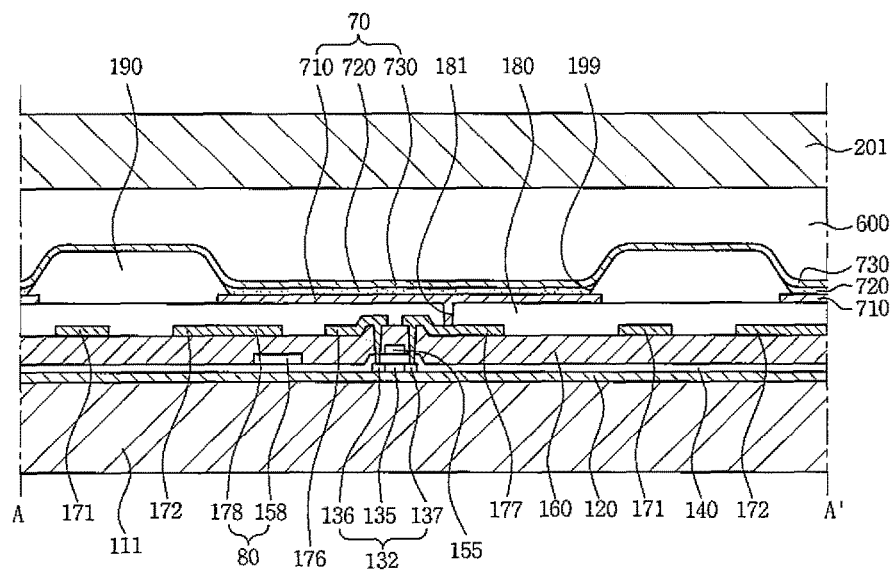
FIG. 6 is a cross-sectional view taken along the line A-A' of FIG. 5.

Although FIGS. 5 and 6 illustrate an active-matrix type organic light emitting diode (AMOLED) device having a 2Tr-1 Cap structure, which includes two thin film transistors ("TFT") 10 and 20 and a capacitor 80 in each pixel by way of example, but the present invention is not limited thereto.

For example, the OLED display device 100 may include three or more TFTs and two or more capacitors 80 in one pixel, and may further include additional wirings for various configurations. Herein, the term "pixel" refers to the smallest unit for displaying an image, and the display area displays an image using a plurality of pixels.

The OLED display device 100 according to the first exemplary embodiment includes the first substrate 111 and a plurality of pixels defined on the first substrate 111. Each pixel may include the switching TFT 10, the driving TFT 20, the capacitor 80, and an OLED 70. The first substrate 111 may further include a gate line 151 disposed along one direction, and a data line 171 and a common power line 172 insulated from and crossing the gate line 151.

Herein, each pixel may be defined by the gate, data, and common power lines 151, 171, and 172, but is not limited thereto.

The OLED 70 may include a first electrode 710, an organic light emitting layer 720 on the first electrode 710, and a second electrode 730 on the organic light emitting layer 720. Herein, at least one first electrode 710 may be formed on each pixel, and thus the first substrate 111 may include a plurality of first electrodes 710 spaced apart from each other.

Herein, the first electrode 710 may be a positive end (anode) serving as a hole injection electrode, and the second electrode 730 may be a negative end (cathode) serving as an electron injection electrode. However, the present invention is not limited thereto. For example, the first electrode 710 may be a cathode and the second electrode 730 may be an anode, based on the driving scheme of the OLED display device 100. Further, the first electrode 710 may be a pixel electrode, and the second electrode 730 may be a common electrode.

The holes and electrons injected into the organic light emitting layer 720 are combined with each other to form excitons, and light is emitted by the energy generated when the excitons falls from an excited state to a ground state.

The capacitor 80 may include a pair of storage electrodes 158 and 178 with an insulating layer 160 interposed therebetween. Herein, the insulating layer 160 may include a dielectric material. The capacitance of the capacitor 80 is determined by electric charges accumulated in the capacitor 80 and voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to the first storage electrode 158.

The driving TFT 20 may apply a driving power to the first electrode 710, which allows the organic light emitting layer 720 of the OLED 70 in a selected pixel to emit light. The driving gate electrode 155 is connected to the first storage electrode 158 which is connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

With the above-described configuration, the switching TFT 10 may be operated by a gate voltage applied to the gate line 151 and may function to transmit a data voltage applied to the data line 171 to the driving TFT 20.

A voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

The configuration of the OLED display device 100 according to the first exemplary embodiment will be described further with reference to FIG. 6 along with FIG. 5.

The OLED 70, the driving TFT 20, the capacitor 80, the data line 171, and the common power line 172 illustrated in FIG. 5 will be mainly described. Further, the switching semiconductor layer 131, the switching gate electrode 152, the switching source and drain electrodes 173 and 174 of the switching TFT 10 may have the same stacked structure as that of the driving semiconductor layer 132, the driving gate electrode 155, the driving source and drain electrodes 176 and 177 of the driving TFT 20 (of FIG. 5), and thus repeated description will not be provided.

According to the present exemplary embodiment, the first substrate 111 may include an insulating substrate formed of glass, quartz, ceramic, plastic and/or the like. However, the present invention is not limited thereto, and the first substrate 111 may include a metal substrate including stainless steel or the like.

In some embodiments, a buffer layer 120 is formed on the first substrate 111. The buffer layer 120 may efficiently reduce infiltration of undesirable elements and may planarize a surface, and may include various materials in accordance therewith. For example, the buffer layer 120 may be formed of silicon nitride ($SiN_x$), silicon oxide ($SiO_2$), and/or silicon oxynitride ($SiO_xN_y$). However, the buffer layer 120 may not always be necessary, and may be omitted based on the kind of the first substrate 111 and process conditions thereof.

In some embodiments, the driving semiconductor layer 132 is formed on the buffer layer 120. The driving semiconductor layer 132 may include a semiconductor material such as, polycrystalline silicon, amorphous silicon, and/or oxide semiconductors. Further, the driving semiconductor layer 132 includes a channel region 135 that is not doped with impurities and p+ doped source and drain regions 136 and 137 that are formed on respective sides of the channel region 135. In this case, p-type impurities, such as boron B, may be used as dopant ions, for example, as a $B_2H_6$. In this regard, such impurities may vary depending on the kinds of the TFT.

In some embodiments, a gate insulating layer 140 formed of silicon nitride ($SiN_x$) or silicon oxide ($SiO_2$) is formed on the driving semiconductor layer 132. The gate insulating layer 140 may include tetra ethyl ortho silicate (TEOS), silicon nitride ($SiN_x$), and/or silicon oxide ($SiO_2$). For example, the gate insulating layer 140 may have a double-layer structure where a silicon nitride ($SIN_x$) layer having a thickness of about 40 nm and a tetra ethyl ortho silicate (TEOS) layer having a thickness of 80 nm are sequentially stacked. However, the gate insulating layer 140 according to the first exemplary embodiment is not limited to the aforementioned configuration.

The driving gate electrode 155, the gate line 151 (refer to FIG. 1), and the first storage electrode 158 are formed on the gate insulating layer 140. In this case, the driving gate electrode 155 is formed to overlap at least a portion of the driving semiconductor layer 132. For example, the driving gate electrode 155 may overlap the channel region 135. The driving gate electrode 155 may serve to prevent the channel region 135 from being doped with impurities when the source and drain regions 136 and 137 of the driving semiconductor layer 132 are doped with the impurities when forming the driving semiconductor layer 132.

The gate electrode 155 and the first storage electrode 158 may be formed on the same layer, and may include substantially the same metal material. In this case, the metal material may include molybdenum (Mo), chromium (Cr), and/or tungsten (W). For example, the gate electrode 155 and the first storage electrode 158 may include molybdenum (Mo) or molybdenum (Mo) alloys.

In some embodiments, the insulating layer 160 is formed on the gate insulating layer 140 to cover the driving gate electrode 155. The insulating layer 160 may be an interlayer insulating layer. The insulating layer 160 may be formed of silicon nitride ($SiN_x$) and/or silicon oxide ($SiO_2$), which is substantially similar to the gate insulating layer 140. The gate insulating layer 140 and the insulating layer 160 may have a contact hole to expose the source and drain regions 136 and 137 of the driving semiconductor layer 132.

The driving source and drain electrodes 176 and 177, the data line 171, the common power line 172, and the second storage electrode 178 are disposed on the insulating layer 160 of the display area DA. The driving source and drain electrodes 176 and 177 are respectively connected to the source and drain regions 136 and 137 of the driving semiconductor layer 132 through the contact hole.

For example, the driving source and drain electrodes 176 and 177, the data line 171, the common power line 172, and the second storage electrode 178 may be formed of refractory metal including molybdenum, chromium, tantalum, titanium and/or metal alloys thereof and may have a multi-layer structure including a refractory metal film and a low-resistance conductive film. The multi-layer structure may include a double-layer structure including a chromium or molybdenum (alloy) lower film and an aluminum (alloy) upper film or a triple-layer structure including a molybdenum (alloy) lower film, an aluminum (alloy) middle film, and a molybdenum (alloy) upper film.

The driving source and drain electrodes 176 and 177, the data line 171, the common power line 172, and the second storage electrode 178 may also be formed of various conductive materials other than the aforementioned materials.

Accordingly, the driving TFT 20 may be formed including the driving semiconductor layer 132, the driving gate electrode 155, and the driving source and drain electrodes 176 and 177. However, the configuration of the driving TFT 20 is not limited thereto, and is susceptible to various modifications.

In some embodiments, a passivation layer 180 is formed on the insulating layer 160 to cover the driving source and drain electrodes 176 and 177, and the like. The passivation layer 180 may be formed of organic materials, such as polyacrylate and/or polyimide, and may be a planarization layer.

The passivation layer 180 may be formed of polyacrylate resins, epoxy resins, phenolic resins, polyamide resins, polyimide resins, unsaturated polyester resins, poly-phenylenether resins, poly-phenylenesulfide resins, and/or benzocyclobutene (BCB).

The passivation layer 180 may have the drain contact hole 181 to expose the driving drain electrode 177.

In some embodiments, the first electrode 710 is formed on the passivation layer 180 and is connected to the driving drain electrode 177 through the drain contact hole 181 of the passivation layer 180.

In some embodiments, a pixel defining layer 190 is formed on the passivation layer 180 to cover the first electrode 710. The pixel defining layer 190 may have an aperture 199 to expose the first electrode 710.

For example, the first electrode 710 may be disposed to correspond to the aperture 199 of the pixel defining layer 190. The pixel defining layer 190 may be formed of resins, such as polyacrylate resins and/or polyimide resins.

Further, the pixel defining layer 190 may be formed of a photosensitive organic material or a photosensitive polymer material. For example, the pixel defining layer 190 may be formed of polyacrylate, polyimide, photo sensitive polyimide (PSPI), photosensitive acryl (PA), and/or photosensitive novolak resins.

In some embodiments, the organic light emitting layer 720 is formed on the first electrode 710 within the aperture 199 of the pixel defining layer 190, and the second electrode 730 may be formed on the pixel defining layer 190 and the organic light emitting layer 720.

Accordingly, the OLED 70 may be formed including the first electrode 710, the organic light emitting layer 720, and the second electrode 730.

One of the first and second electrodes 710 and 730 may be formed of a transparent conductive material and the other thereof may be formed of a transflective or reflective conductive material. Depending on the material forming the first and second electrodes 710 and 730, the OLED display device 100 may become a top-emission type, a bottom-emission type, or a dual-side-emission type (i.e., emitting toward both top and bottom sides).

For example, when the OLED display device 100 according to the first exemplary embodiment is provided as a top-emission type, the first electrode 710 may be formed of the transflective or reflective conductive material, and the second electrode 730 may be formed of the transparent conductive material.

The transparent conductive material may include indium tin oxides (ITO) indium zinc oxides (IZO), zinc oxide (ZnO), and/or indium oxide ($In_2O_3$). The reflective material may include lithium (Li), calcium (Ca), lithium fluoride/calcium (LiF/Ca), lithium fluoride/aluminum (LiF/Al), aluminum (Al), silver (Ag), magnesium (Mg), and/or gold (Au).

The organic light emitting layer 720 may be formed of a low molecular weight organic material or a high molecular weight organic material. The organic light emitting layer 720 may have a multi-layer structure including a light emitting layer and a hole injection layer ("HIL"), a hole transporting layer ("HTL"), an electron transporting layer ("ETL") and/or an electron injection layer ("EIL"). For example, the HIL may be disposed on the first electrode 710, which is a positive end, and the HTL, the light emitting layer, ETL, and EIL may be sequentially stacked thereon.

According to the first exemplary embodiment, the organic light emitting layer 720 is formed only within the aperture 199 of the pixel defining layer 190, but the present invention is not limited thereto. For example, one or more layers of the organic light emitting layer 720 may be disposed not only on the first electrode 710 but also between the pixel defining layer 190 and the second electrode 730, within the aperture 199 of the pixel defining layer 190. For example, HIL, HTL, ETL, EIL, and the like of the organic light emitting layer 720 may be formed using an open mask in an area other than the aperture 199, and the light emitting layer of the organic light emitting layer 720 may be formed on each aperture 199 using a fine metal mask (FMM).

When an LCD device is used in the embodiments of the present invention, the first electrode 710 may be physically and electrically connected to the driving drain electrode 177 through the drain contact hole 181 and may receive a data voltage from the driving drain electrode 177. The first electrode 710 which receives the data voltage may generate an electric field, along with the second electrode 730 (common electrode) which receives a common voltage, such that a direction of liquid crystal molecules of a liquid crystal layer between the first electrode 710 and the second electrode 730 may be determined. The first electrode 710 and the second electrode 730 may form a capacitor (hereinafter "a liquid crystal capacitor"), which may maintain an applied voltage although the TFT is turned off.

In some embodiments, the second substrate 201 is sealingly attached to the first substrate 111 with the OLED 70 interposed therebetween. The second substrate 201 may cover and protect the TFTs 10 and 20 and the OLED 70 formed on the first substrate 111 to be sealed from the outside. The second substrate 201 may use an insulating substrate commonly formed of glass and/or plastic. When the OLED display device 100 is provided as a top-emission type in which an image is displayed toward the second substrate 201, the second substrate 201 may be formed of a light-transmissive material.

In some embodiments, a buffer member 600 is disposed between the first and second substrates 111 and 201. The buffer member 600 may protect inner components, such as the OLED 70, from shocks which may be applied from the outside of the OLED display device 100, and may enhance device reliability of the OLED display device 100. The buffer member 600 may include an organic sealant, such as a urethane-based resin, an epoxy-based resin, and/or an acrylic resin, and/or an inorganic sealant, such as silicon. The urethane-based resin may include, for example, urethane acrylate. The acrylic resin may include, for example, butyl acrylate and/or ethylhexylacrylate.

Hereinafter, an OLED display device 100 according to a second exemplary embodiment will be described with reference to FIGS. 7 and 8. The repeated descriptions with respect to the same configurations as those of the first exemplary embodiment will be omitted for brevity.

Figure 7:
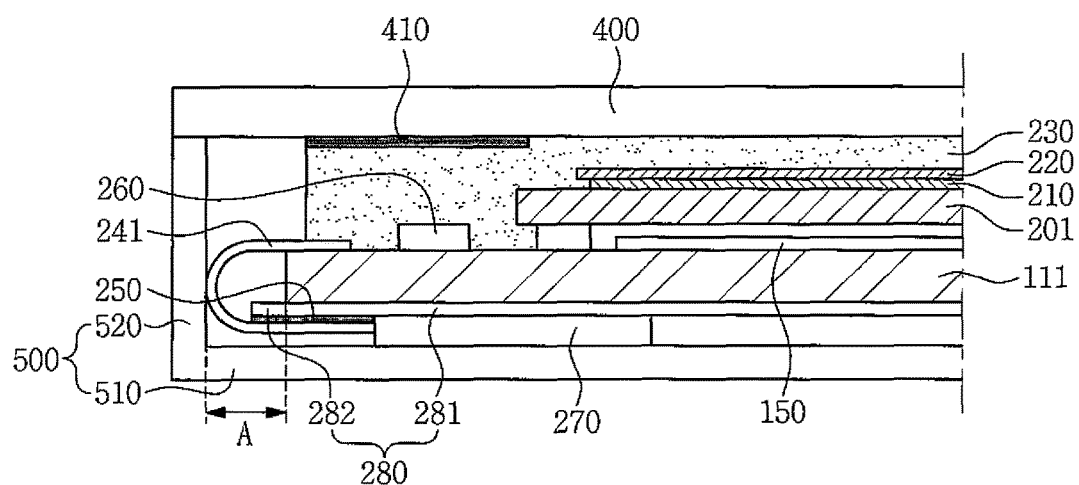
FIGS. 7 and 8 are schematic cross-sectional views illustrating a display device according to a second exemplary embodiment.
Figure 8:
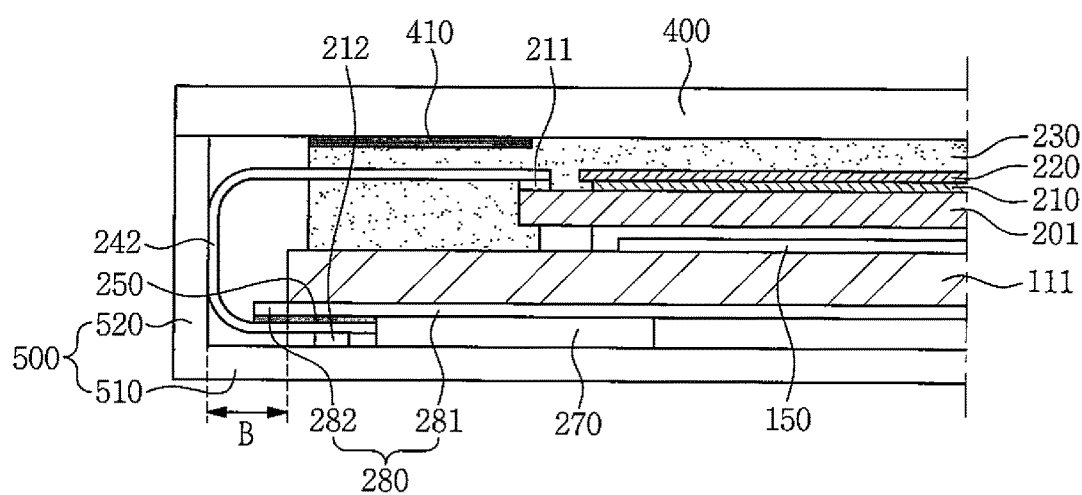

FIGS. 7 and 8 are schematic cross-sectional views illustrating the OLED display device 100 according to the second exemplary embodiment.

In reference to FIGS. 7 and 8, the OLED display device 100 may further include a printed circuit board 270 connected to a circuit board 240 (refer to FIG. 1). The printed circuit board 270 may be a circuit board which applies driving signals to the display panel 200. The printed circuit board 270 may include a timing controller configured to generate control signals for driving the display panel 200 and a power voltage generator configured to generate a power voltage. In other words, the second exemplary embodiment provides an example in which the printed circuit board 270 and the flexible printed circuit board are separately manufactured.

The printed circuit board 270 may be disposed on a surface of a display panel 200. For example, the printed circuit board 270 may be disposed on a rear surface of the display panel 200. The display panel 200 may commonly display images on an upper surface of the display panel 200, and thus visibility to users from the rear surface of the display panel 200 may be blocked from users. Accordingly, in order to maximize spatial efficiency and conceal configurations, which do not have to be visible to the users, the printed circuit board 270 may be disposed on the rear surface of the display panel 200. However, the foregoing is merely given by way of example, and the printed circuit board 270 may be disposed on a lateral surface of the display panel 200.

The printed circuit board 270 according to the second exemplary embodiment may be mounted with electronic elements configured to generate electric signals to be applied to a driving chip 260 and a touch driving chip 212. Differently from the first exemplary embodiment, a first circuit board 241 and a second circuit board 242 may not generate electric signals on their own, and may connect the display panel 200 and the printed circuit board 270. For example, the first circuit board 241 may connect the printed circuit board 270 and the driving chip 260 of the first substrate 111, and the second circuit board 242 may connect the printed circuit board 270 and a touch unit 210. The circuit board 240 may electrically connect the display panel 200 and the printed circuit board 270.

From the foregoing description, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings, but, on the contrary, is intended to cover various modifications and equivalent arrangements included within the spirit and scope of the appended claims and their equivalents. Thus, various features of the above described and other embodiments can be mixed and matched in any manner, to produce further embodiments consistent with the invention.

What is claimed is:

1. A display device comprising:
   a display panel comprising a first substrate having a display area and a pad area and a second substrate disposed to oppose the first substrate;
   a circuit board connected to the pad area, and configured to apply an electric signal to the display panel;
   a set frame configured to accommodate the display panel; and
   a buffer member between a surface of the display panel and the set frame,
   wherein the buffer member comprises:
      a base directly contacting one surface of the first substrate between the second substrate and the set frame, and having a same shape as a shape of the first substrate; and
      a protrusion adjacent the base and protruding from an edge of the first substrate, and
   wherein the base and the protrusion have a uniform thickness,
   wherein the base overlaps at least one portion of the display area in a plan view, and
   wherein the circuit board is attached to the protrusion.

2. The display device of claim 1, wherein the circuit board is between the set frame and the buffer member.

3. The display device of claim 2, further comprising a double-sided tape between the buffer member and the circuit board.

4. The display device of claim 3, wherein the circuit board is bent along a lateral surface of the display panel.

5. The display device of claim 4, wherein the protrusion is disposed at a bent portion of the circuit board.

6. The display device of claim 2, wherein the circuit board comprises a first circuit board on an upper surface of the first substrate in the pad area.

7. The display device of claim 6, wherein the first circuit board is bent along a lateral surface of the first substrate.

8. The display device of claim 7, wherein the protrusion is disposed at a bent portion of the first circuit board.

9. The display device of claim 6, further comprising a touch unit on the second substrate.

10. The display device of claim 9, wherein the circuit board comprises a second circuit board on an upper surface of the second substrate, the circuit board being connected to the touch unit.

11. The display device of claim 10, wherein the second circuit board is bent along lateral surfaces of the first substrate and the second substrate.

12. The display device of claim 11, wherein the protrusion is disposed at a bent portion of the second circuit board.

13. The display device of claim 9, wherein the touch unit corresponds to the display area.

14. The display device of claim 1, wherein the electric signal comprises at least one of a power signal, a driving signal, a control signal, and a data signal.

15. A display device comprising:
   a display panel comprising a first substrate having a display area and a pad area and a second substrate disposed to oppose the first substrate;
   a circuit board connected to the pad area, and configured to apply an electric signal to the display panel;
   a set frame configured to accommodate the display panel; and
   a buffer member between a surface of the display panel and the set frame,
   wherein the buffer member comprises:
      a base directly contacting one surface of the first substrate between the second substrate and the set frame, and having a same shape as a shape of the first substrate; and
      a protrusion adjacent the base and protruding from an edge of the first substrate, and
   wherein the base and the protrusion have a uniform thickness,
   wherein the base overlaps at least one portion of the display area in a plan view, and
   wherein the base has a width wider than that of the protrusion, and the width is perpendicular to both a thickness direction of the buffer member and a direction in which the protrusion protrudes from the edge of the display panel.

16. The display device of claim 1, wherein the circuit board comprises a first circuit board on an upper surface of the first substrate and a second circuit board on an upper surface of the second substrate, and
   wherein the protrusion is disposed at both a bent portion of the first circuit board and a bent portion of the second circuit board.

17. A display device comprising:
   a display panel comprising a first substrate having a display area and a pad area and a second substrate disposed to oppose the first substrate;
   a circuit board connected to the pad area, and configured to apply an electric signal to the display panel;
   a set frame configured to accommodate the display panel; and
   a buffer member between a surface of the display panel and the set frame, and having a planar shape,
   wherein the buffer member comprises:
      a base; and
      a protrusion adjacent the base and protruding from an edge of the first substrate, and
   wherein the base has a width wider than that of the protrusion, and the width is perpendicular to both a thickness direction of the buffer member and a direction in which the protrusion protrudes from the edge of the display panel, and
   wherein the base overlaps at least one portion of the display area in a plan view.

18. The display device of claim 17, further comprising:
   a window on the second substrate; and
   a touch unit between the window and the second substrate.

19. The display device of claim 18, wherein the circuit board comprises:
   a first circuit board on an upper surface of the first substrate in the pad area; and
   a second circuit board on an upper surface of the second substrate, the circuit board being connected to the touch unit.

20. The display device of claim 19, wherein the protrusion is disposed at both a bent portion of the first circuit board and a bent portion of the second circuit board.

21. A display device comprising:
- a display panel comprising a first substrate having a display area and a pad area and a second substrate disposed to oppose the first substrate;
- a circuit board connected to the pad area, and configured to apply an electric signal to the display panel;
- a set frame configured to accommodate the display panel; and
- a buffer member between a surface of the display panel and the set frame,
- wherein the buffer member comprises:
  - a base directly contacting one surface of the first substrate between the second substrate and the set frame, and having a same shape as a shape of the first substrate; and
  - a protrusion adjacent the base and protruding from an edge of the first substrate, and
- wherein the base and the protrusion have a uniform thickness,
- wherein the base overlaps at least one portion of the display area in a plan view, and
- wherein the display area has a width wider than that of the protrusion, the width being perpendicular to both a thickness direction of the protrusion and a direction in which the protrusion protrudes from the edge of the display panel.

* * * * *